United States Patent [19]
Deambrosio et al.

[11] Patent Number: 5,121,874
[45] Date of Patent: * Jun. 16, 1992

[54] SHIELD GAS WAVE SOLDERING

[75] Inventors: Carlos A. Deambrosio, LaPrairie; John Gileta, Chateauguay, both of Canada

[73] Assignee: Electrovert Ltd., La Prairie, Canada

[*] Notice: The portion of the term of this patent subsequent to Sep. 3, 2008 has been disclaimed.

[21] Appl. No.: 626,728

[22] Filed: Dec. 13, 1990

Related U.S. Application Data

[60] Division of Ser. No. 441,009, Nov. 22, 1989, and a continuation-in-part of Ser. No. 441,009, Nov. 22, 1989, Pat. No. 5,044,542.

[51] Int. Cl.$^5$ .............................. B23K 1/00; B23K 3/00
[52] U.S. Cl. .................................. 228/219; 228/232; 228/262; 228/37
[58] Field of Search ................. 228/219, 37, 43, 232, 228/180.1, 262

[56] References Cited

U.S. PATENT DOCUMENTS

| | | | |
|---|---|---|---|
| 2,082,622 | 6/1937 | Fink | 427/357 |
| 4,254,158 | 3/1981 | Fukuzuka et al. | 427/357 |
| 4,538,757 | 9/1985 | Bertiger | 228/37 |
| 4,600,137 | 7/1986 | Comerford | 228/180.2 |
| 4,606,493 | 8/1986 | Christoph et al. | 228/219 |
| 4,610,391 | 9/1986 | Nowotarski | 228/37 |
| 4,684,056 | 8/1987 | Deambrosio | 228/37 |
| 4,848,642 | 7/1989 | Kondo | 228/37 |
| 4,921,156 | 5/1990 | Hohnerlein | 228/37 |

FOREIGN PATENT DOCUMENTS

| | | | |
|---|---|---|---|
| 95854 | 8/1978 | Japan | 228/219 |
| 54-2243 | 1/1979 | Japan | 228/110 |
| 27771 | 2/1984 | Japan | 228/37 |
| 174778 | 7/1988 | Japan | 228/219 |

OTHER PUBLICATIONS

M. Nowotarski, "Fluxless Soldering With Nitrogen",: Proc. NEPCON West (Feb. 26–Mar. 1, 1990), pp. 459–472 (publication date unknown).

M. Nowotarski, et al., "The Effect of a Nitrogen Atmosphere on the Wave Tinning of Component Leads," Presented at NEPCON West (Feb. 25–27, 1986) (precise publication date unknown).

IBM Technical Disclosure Bulletin, "Oxidation Prevention", vol. 11, No. 12, p. 1687, May 1969.

Hartmann, H. J., "Lötsystem mit Schutzgaslöt Zone", pp. 22–31, Nov. 2, 1989.

Primary Examiner—Samuel M. Heinrich
Attorney, Agent, or Firm—Darby & Darby

[57] ABSTRACT

A wave soldering apparatus and process occurs in an atomsphere which substantially excludes oxygen. By providing a gas blanket over the solder, reduction in dross occurs and improved soldering results avoiding the necessity of removing flux residues. Gas diffusers are provided on both sides of a solder wave in an enclosure, the diffusers are placed below the path of the element to be soldered and a further gas diffuser is positioned above the element to be soldered. The gas diffusers supply a calm gas blanket over the solder wave so no turbulent movement of gas occurs within the enclosure.

38 Claims, 3 Drawing Sheets

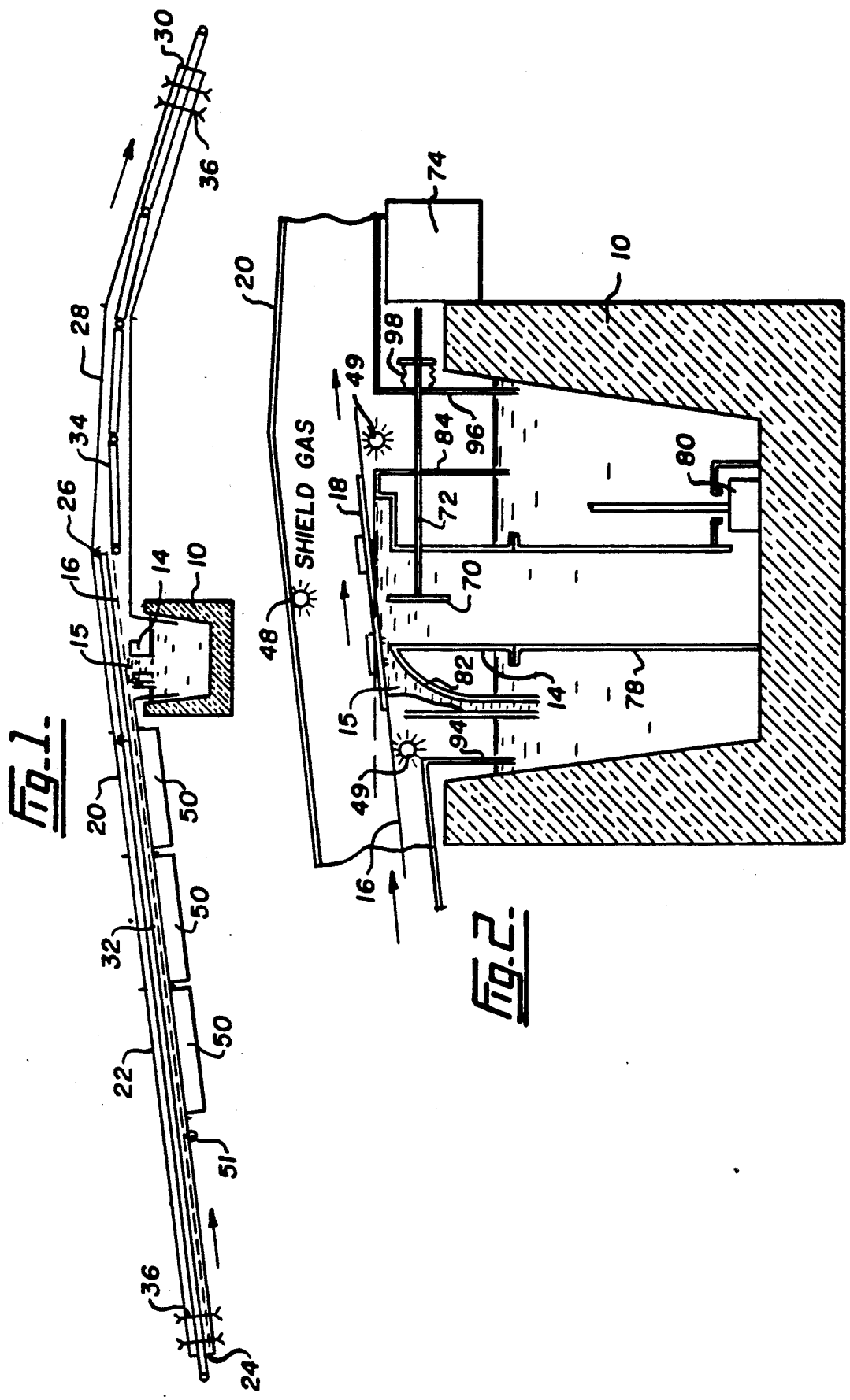

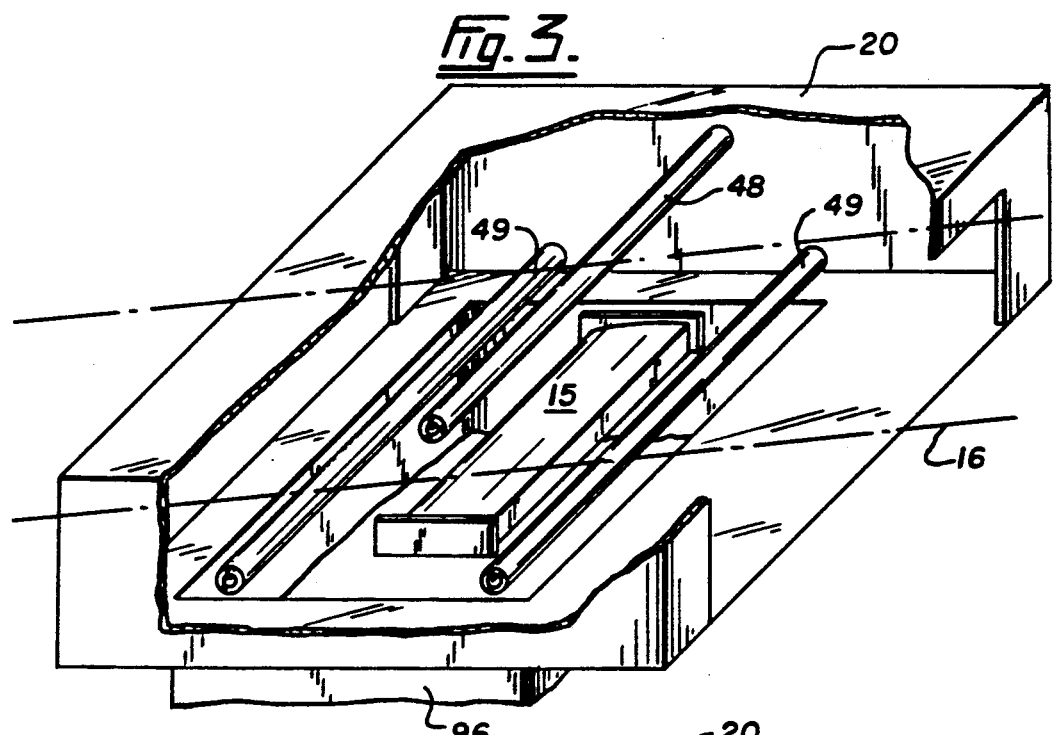
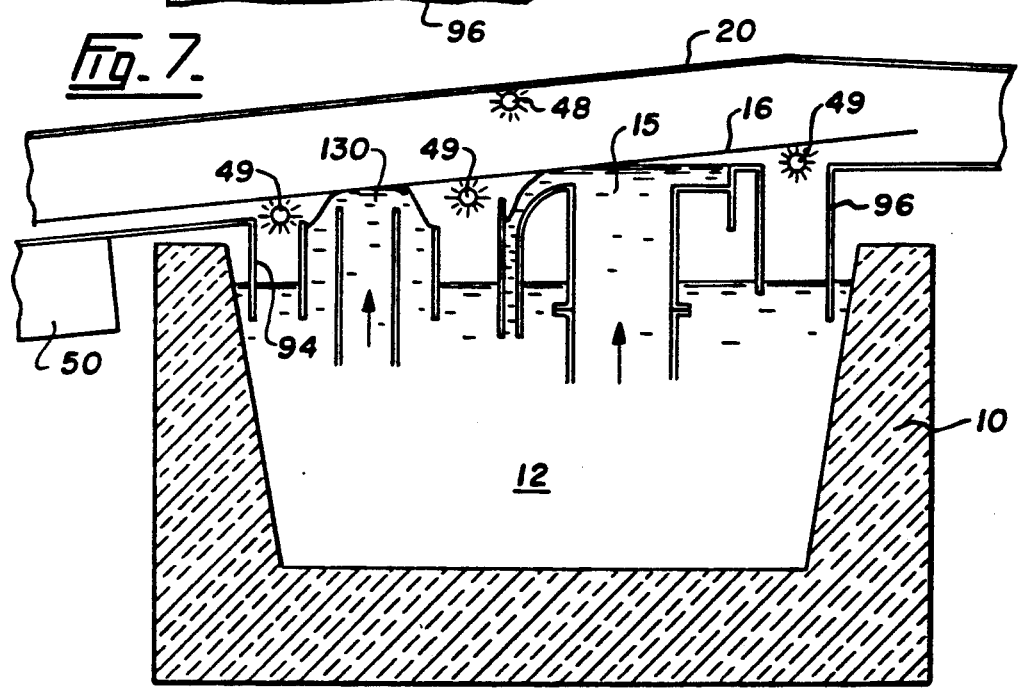
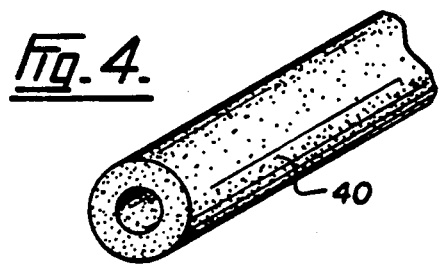

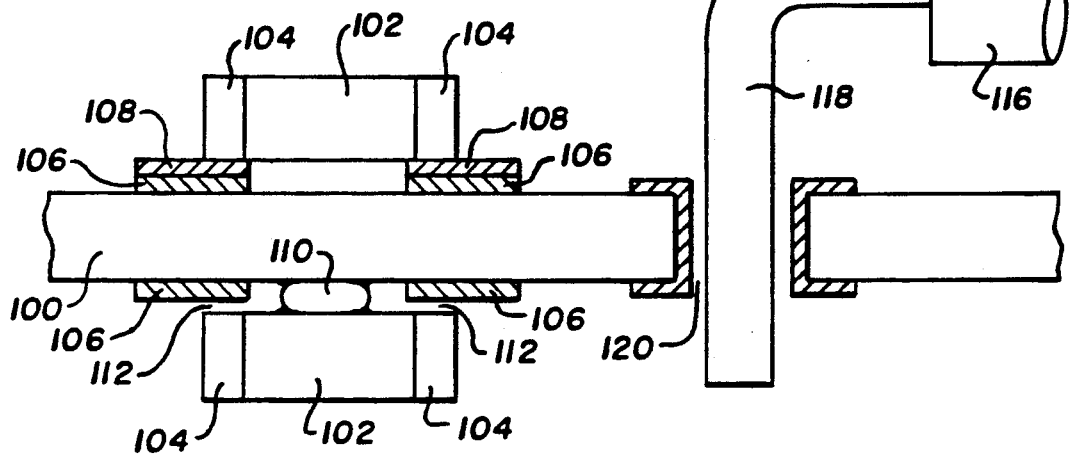
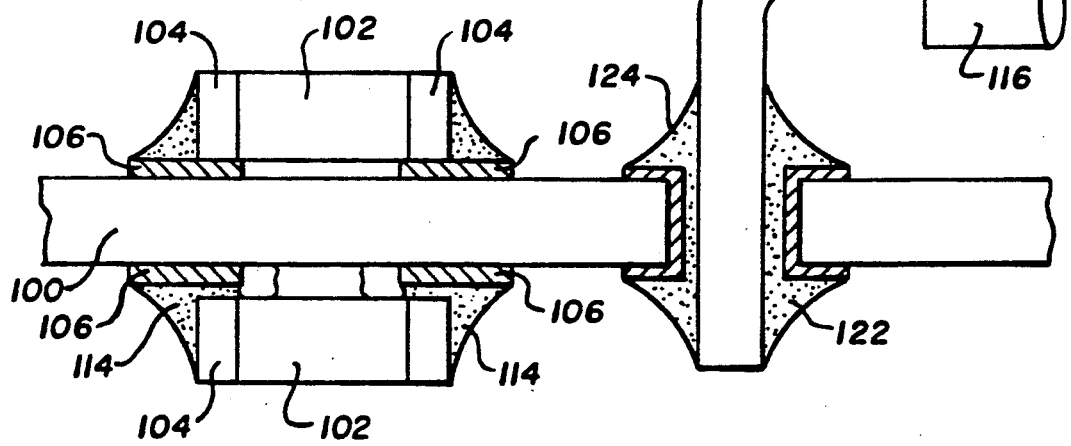

SHIELD GAS WAVE SOLDERING

This application is both a divisional and a continuation in part of U.S. patent application Ser. No. 441,009 filed Nov. 22, 1989 now U.S. Pat. No. 5,044,542.

The present invention relates to wave soldering of elements such as printed wiring boards, and more specifically the present invention relates to wave soldering in an atmosphere which substantially exoludes oxygen.

BACKGROUND OF THE INVENTION

For many years wave soldering systems have required flux to promote wetting and good solder joints through removal of surface oxides on the metallic surfaces to be soldered, both on the circuit boards and on the component leads of printed wiring boards. More recently inert gas soldering, generally nitrogen gas and/or other inert gases, has shown some benefits in the reduction of the amount of flux required in soldering. The inert gases cover the liquid solder surfaces and prevent oxidation of the solder. By reducing flux to the extent that it may even be eliminated, and still being able to prevent oxidation of the solder one avoids the necessity for cleaning after the soldering step and this is normally needed to remove the flux residues. Such an operation in expensive.

As well as inert gas, soldering has been conducted in an atmosphere which substantially excludes oxygen and this is the key to fluxless soldering. Forming gas which is a mixture of nitrogen and hydrogen has certain advantages for soldering in that it is purported to promote hole filling in circuit boards without the use of flux.

Soldering in a shield gas atmosphere substantially excluding oxygen is known. The gas permits fluxless soldering, for instance German patent publication Ser. No. DE 3309648 to Siemens shows the application of shield gas to a printed circuit board in a passage prior to soldering. German petty patent G 85 20 254.1 discloses soldering inside chambers which are filled with shield gas, the items to be soldered are transported on convoyoro through these chambers. Vestibules at eash end are shown to ensure that a minimum of shield gas escapes from the soldering chamber. German patent application DE 3737563 discloses another system wherein the elements pass in a tunnel-like housing. The housing has a number of curves in it so that the entry and the exit are below where the soldering occurs to ensure that shield gas remains within the tunnel.

Some of the features of shield gas soldering often referred to as inert gas soldering, are disclosed in an article entitled Soft Soldering Under Cover Gases by H. J. Hartman. The system discloses reflow soldering as well as wave soldering.

One problem with inert or shield gas soldering occurs when gas is directed at the solder wave or solder surface. Jets of gas can cause turbulence in the atmosphere and ripples on the solder surface and in some cases this affects solder wetting. Furthermore, if shield gas jets cause turbulence which can cause air to mix with the shield gas and dilute the inert gas, generally nitrogen. This also adversely affects the soldering results.

Any introduction of gas through an outlet that directs the gas in one direction can create turbulence in a tunnel like enclosure. This can result in air being present in the enclosure and is particularly relevant when a short hood covering only the solder pot is used.

Nowotarski in U.S. Pat. No. 4,610,391 discloses utilizing gas diffusers on both sides of a solder wave, to contact a portion of an active dross forming area of the surface of the solder wave, and a portion of the solder wave which contact a work piece with an inert gas. In U.S. Pat. No. 4,821,947, Nowotarski disclosed inerting an area where solder is applied to two essentially flux free metal surfaces.

One of the difficulties with shield gas soldering systems in fluxless soldering includes the problems of soldering circuit boards and the like which contain plated metallized plated holes, either with or without component leads which have to be filled with solder. The holes have metallized plating connecting the lower face of the circuit board with internal layers and/or a top layer. Without flux, it is found that with the preferred gas, nitrogen, the soldering operation does not promote the capillary rise or wetting of the solder from the solder wave to wick up the metallized plated hole, and this is an essential specification in the entire Electronics industry. Therefore at the present time additional conventional or liquid type low solids fluxes are required to ensure that the solder wicks up the metallized plated hole. By the addition of fluxes one again causes deposits to form on the soldered item, carriers or pallets, if used, and on the liquid surface of a solder pot. This requires removing the flux deposit from the carriers or pallets it used, and in some cases from the items to be soldered. This may also cause a layer to form on the solder pot which must be skimmed from time to time.

SUMMARY OF THE INVENTION

It is an aim of the present invention to provide a soldering system for printed circuit boards and the like which does not require the application of flux and improves the capillary action for metallized plated holes through the face of a circuit board.

It is a further aim of the present invention to provide an arrangement of diffusers to supply shield gas within an enclosure to blanket the solder wave and solder surface in the solder pot and provide a claim atmosphere in the enclosure without turbulence or vortexes occuring. A still further aim is to prevent air being entrained into the tunnel to add oxygen with the shield gas.

The present invention provides a process wherein the solder wave is oscillated in accordance with a vibratory wave soldering arrangement disclosed in U.S. Pat. No. 4,684,056 to Deambrosio. In this patent the solder wave is subjected to an oscillation or vibration during the passage of a printed wiring board therethrough. The oscillation or vibration aids in filling the metallized plated holes in the boards, crevices and corners adjacent to a solder mask and all other areas where solder wetting is difficult to achieve with conventional machines. Furtermore, by conducting the soldering in a shielded atmosphere substantially excluding oxygen, truly fluxless soldering can occur and the solder appears shiny and has little or not dross formed, as oxygen is excluded from the process.

The present invention provides a process for wave soldering an element comprising the steps of preheating the element in a shield gas atmosphere substantially excluding oxygen; moving the element in a predetermined path; forming at least one solder wave beneath the path so that at least a portion of the element passes through the solder wave while maintaining liquid solder surfaces exposed to the shield gas, producing an oscillation in the solder wave during passge of the element therethrough, and maintaining the element in the shield gas atmosphere until solder on the element has solidified.

Also provided in the present invention is a process for wave soldering an element comprising the steps of moving the element in a predetermined path through a shield gas atmosphere substantially excluding oxygen; forming a solder wave beneath the path so that at least a portion of the element passes through the solder wave, and supplying shield gas through at least one first diffuser on one side of the solder wave positioned below the path, through at least one second diffuser on the other side of the solder wave positioned below the path, and through at least one third diffuser over the solder wave positioned above the path, such that shield gas blankets the solder wave and surrounds the element passing therethrough.

The present invention also provides an apparatus for wave soldering an element comprising an enclosure for a shield gas atmosphere substantially excluding oxygen, the enclosure having an entry and an exit; means for forming at least one solder wave in the enclosure above a solder reservoir; means for conveying the element in a predetermined path through the enclosure from the entry to the exit, the path ensuring at least a portion of the element passes through the solder wave from one side to the other sidem at least one shield gas diffuser in the enclosed positioned on the one side of the solder wave below the predetermined path, at least one shield gas diffuser in the enclosure positioned on the other side of the solder wave below the predetermined path, and at least one shield gas diffuser in the enclosure positioned over the solder wave above the predetermined path, all of the shield gas diffusers providing a shield gas blanket within the enclosure for the solder wave and solder reservoir.

BRIEF DESCRIPTION OF THE DRAWINGS

In drawings which illustrate embodiments of the present invention by way of example, FIG. 1 is a side elevational view showing a solder pot and enclosure suitable for the process of the present invention.

FIG. 2 is a detailed side view of the solder pot shown in FIG. 1.

FIG. 3 is an isometric view of the solder pot shown in FIG. 1 showing the diffusers for shield gas.

FIG. 4 is a partial isometric view of a portion of a diffuser.

FIG. 5 is a detailed side view of a section of a circuit board prior to soldering.

FIG. 6 is a detailed side view of the circuit board shown in FIG. 5 after soldering.

FIG. 7 is a detailed side view of a solder pot similar to that shown in FIG. 1 with the addition of a further solder wave nozzle.

DETAILED DISCLOSURE OF THE INVENTION

One embodiment of an apparatus for wave soldering according to the present invention is shown in FIG. 1, 2 and 3. A insulated solder reservoir 10 contains solder 12 in liquid form and a solder nozzle 14 projects a solder wave 15 up above the solder reservoir 10 into a conveyor path 16 on which moves elements 18 such as circuit boards and other electronic devices. The soldering occurs within an enclosure 20 which contains a shield gas substantially excluding oxygen. The enclosure 20 has substantially two tunnels a first portion 22 extending up from an entrance 24 to an apex 26 which is adjacent to the solder reservoir 10, and a second portion 28 which extends down to an exit 30. Preheating of the elements is shown occurring in the first portion 22 of the tunnel 20, although in certain circumstances preheating may not be needed or may occur from a first solder wave. Cooling occurs to the elements 18 in the second portion 28 of the tunnel. The cooling is sufficient to allow the solder to solidify. In most cases there is not need for special cooling systems such as coils within the second portion 28. The entrance 24 and the exit 30 to the tunnel are peferably on the same elevation so that the shield gas, which in a preferred embodiment is nitrogen and lighter than air, remains in the enclosure 20 and does not escape from the entrance or exit. The nitrogen or other shield gas within the enclosure 20 has a lower density than ambient air and hence assists in retaining the gas in the enclosure 20. A first conveyor 32 is positioned in the first portion 22 of the tunnel 20. The first conveyor 32 moves the elements 18 in the path 16 from the entry 24 through the solder wave 15 to approximately the apex 26 of the enclosure 20. The elements 18 are then deposited on a second conveyor 34 which takes them through the second portion 28 of the tunnel 20 to the exit 30. A flat belt conveyor or other suitable conveyor may also be used.

Gas jet curtains 36 are shown at the entry 24 and the exit 30 to the tunnel 20. The curtain are supplied in another embodiment to prevent air entering the tunnel 20, and shield gas in the tunnel 20 escaping. The gas used in the curtains 36 is preferably a shield gas such as nitrogen. Other types of curtains in the form of fabric flaps or the like may also be used.

A first shield gas diffuser 48 is shown above the conveyor path 16 over the solder pot 10 in FIG. 2 and 3 and two futher shield gas diffusers 49 are positioned one on each side of the solder wave below the conveyor 32. The shield gas blankets the liquid solder at all times when it is liquid including the solder wave 15 and the surface of the liquid solder in the reservoir 10.

The diffusers 48, 49 are shown in FIG. 3 extending beyond the length of the solder wave 15 so that a complete shield gas blanket is applied to the solder reservoir 10 including the solder wave 15. The diffusers are made from stainless steel 316 in one embodiment. Other alloys that do not wet with solder may also be used. The porous tube, generally sintered metal, has pore sizes from about 2 to 5 microns. It has been found that if large holes remain in a tube, or even small holes, jets or gas occur out of each hole which create turbulence in the atmosphere within the enclosure 20. This can cause air to be entrained with the shield gas in the enclosure which is unacceptable. Furthermore, turbulence within the enclosure 20 disturbs the surface of the liquid solder causing ripples to form which adversely affect the soldering results. By using in one embodiment, a tubular shape, wherein the gas is dispersed all around the tube to avoid any turbulent movement of gas in the enclosure 20 provides a calm gas blanket so no ripples occur on the surface of the solder. The diffuser need not be limited to a tubular shape, for instance a flat or curved plate diffuser may also be used.

In one embodiment the internal diameter of the diffusers is in the range of about $\frac{1}{4}$ to $\frac{3}{8}$". The flow rate of gas depends partly on the gas pressure. FIG. 4 illustrates a sintered tube 40 suitable for a diffuser with pores in the wall of the tube for releasing gas. In one embodiment, the diffuser is connected to a gas supply at one end, and has the other end closed.

In one embodiment formic acid in gaseous form is added to the shield gas prior to feeding into the enclosure 20. The shield gas is bubbled through liquid formic acid and the gaseous mix is fed out through the diffusers 48 and 49. The formic acid assists in eliminating and preventing dross that may be present in the solder, and helps to keep the solder clean. Other additives may be added to the shield gas, acetic acid also assists in removing dross and oxides on a circuit board.

Panel heaters 50 are shown in FIG. 1 below the first conveyor 32 in the first portion 22 of the tunnel 20. Whereas the panel heaters are shown only below the tunnel 20, it will be apparent that they may also be placed above or on both sides of the tunnel 20 or even in the tunnel 20. The heaters may be IR panel heaters or other suitable types of heaters, and preheat the elements 18 prior to wave soldering. The preheating of the elements 18 occurs within the first portion 22 of the tunnel 20 before soldering. By heating in a shield gas atmosphere, there is little or no oxygen remaining in the metallized plated holes and crevices of the elements 18, and no new oxide develops on the metallic surfaces to be soldered by the heating action of the preheaters.

In another embodiment, adipic acid is added to the elements 18 prior to heating. The adipic acid in solution form is preferably sprayed onto the elements from nozzle 51. The nozzle 51 is preferably located below the conveyor 32, and sprays upwards to clean any oxides present on circuit boards or the like. It is found in some circumstances the adipic acid solution enhances capillary action of metallized plated holes in the boards. The adipic acid may also be applied by foaming, brush application or other suitable applicators. Whereas adipic acid is disclosed, other gaseous or acidic additives may also be added to perform the same function.

In one embodiment as shown in FIG. 2 the solder reservoir assembly 10 has a solder nozzle arrangement similar to that shown in U.S. Pat. No. 4,684,056 with a vibrating vane 70 in the form of a flat strip positioned in the nozzle 14 and the connecting rod 72, which in a larger solder wave is two or three rods, extends through an aperture in the exit side of the nozzle 14 to a vibrator 74 mounted on the outside of the solder reservoir 10. The frequency and/or amplitude of vibration is controllable by the vibrator 74. The vibration is preferably in the range of about 20 to 400 Hz and occurs during the passage of the element 18 through the solder wave 15. This vibration does not substantially change the configuration of the solder wave and is hardly visible to the eye other than a slight shimmer. However the improved results are observed as the pressurizing effect of the solder fills the metallized plated holes in the circuit boards.

Whereas the vane 70 is shown to vibrate backwards and forwards in substantially the same plane of movement as the elements 18. It will be apparent that the vane could be mounted across the solder wave. Other embodiments are disclosed in U.S. Pat. No. 4,684,056. Other types of devices to provide a pressurized effect on the elements 18 from the solder wave 15 such as wave makers, rotating pulsing devices may also be used. In another embodiment a stepping drive motor may be used for the solder pump to provide a series of pulsations in the solder wave.

The solder wave nozzle 14 is connected by means of a flange 76 to a solder conduit 78, which in turn is connected to a pump 80 for pumping solder 12 from the solder reservoir 10 up through the nozzle 14. The entry side of the nozzle 14 has a guide 82 to provide a downward sloping path for a portion of the solder. The exit solder wave flows to a weir plate 84 to provide a solder wave configuration similar to that shown in U.S. Pat. No. 4,684,056.

The solder reservoir 10 has an entry skirt 94 and an exit skirt which are attached to the lower surface of the tunnel 20. The skirts extend around all four sides of the opening in the lower surface of the tunnel 20. The skirts are sealed at the four corners, so no shield gas can escape and no air can enter the tunnel 20. The skirts 94 and 96 are sealed tightly to the tunnel and extend down into the solder 12 in the solder pot 10 and thus provide a liquid seal in the solder pot 10 to prevent inert gas from escaping. When a vibrating vane as shown in FIG. 2 is provided, a bellows type seal 98 surrounds the connecting rod 72 as it passes through the skirt 96 so that shield gas is contained within the enclosure. The seal 98 permits the rod 72 to vibrate.

FIG. 3 shows an enclosure 20 that has a skirt 96 or liquid seal extending down to fit into a solder reservoir 10. The solder wave 15 is shown in the enclosure 20 with two diffusers 49 on each side of the solder wave 15 below the predetermined conveyor path 16 and a single diffuser 48 above the path 16 over the solder wave 15. The enclosure 20 extends a short distance on one side of the solder reservoir 10 to an entry and on the other side of the reservoir 10 to an exit. The enclosure 20 is of sufficient length to provide a gas blanket over the solder wave 15 and the solder surface in the reservoir. The enclosure 20 may be made to take a conveyor at an angle sloping upwards, or may be substantially horizontal.

The enclosure 20 may be made as a retrofit enclosure to fit on existing wave soldering machines or may be incorporated in a new soldering machine. The entry and exit to the enclosure may have curtains, such as flaps to retain an inert atmosphere in the enclosure 20. Some gas escapes from the enclosure 20 and is replenished from the gas diffusers 48 and 49. In another embodiment gas jet curtains 36 as shown in FIG. 1 may be provided at the entry and exit to the enclosure 20. When the enclosure 20 shown in FIG. 3 is provided, preheating of the elements generally occurs prior to entry into the shield gas atmosphere.

Some circuit boards may have chips and other components attached to both sides of a board and in such conditions reflow soldering may be used together with wave soldering. FIG. 5 illustrates a section of a circuit board 100 having surface mounted components 102 on the top and bottom. Solderable terminals 104 need to be soldered to metallic circuit pads 106 leading to circuits within the board 100. In the case of the top mounted component 102, solder paste 108 is preapplied to the top pads 106. An adhesive 110 holds the bottom component 102 to the board 100, and a hard to solder area remains between the terminals 104 and the pads 106. Although a gap 112 is shown between the terminals 104 and the pads 106, most of the time the two are touching.

The circuit board 100 is passed into an enclosure 20 containing a shield gas as shown in FIG. 4, and heaters, generally infrared heaters, heat the board from above causing the solder paste 108 to melt and flow. The board 100 then passes through the solder wave 15 to form solder joints on both sides of the board with the vibratory solder wave 15 forming the solder joints 114 as shown in FIG. 6.

A leaded component 116 has a lead 118 passing through a metallized plated hole 120 as shown in FIG. 5. The solder applied by the vibratory solder wave 15 forms the solder joint 122 as shown in FIG. 6 exhibiting efficient metallized plated hole filling including the desired top-side fillet 124.

In certain soldering devices, two or more waves may be used either from a single solder pot or from different solder pots. The waves may be turbulent or smooth. In some instances the first wave may be turbulent and a second wave is a smooth wave. In some instances a vibratory device may be applied to either or both solder waves. In another embodiment a first wave may be at a lower temperature to reduce thermal shock. FIG. 7 illustrates a first solder wave 130 upstream of the solder wave 15. The first solder wave 130 is a turbulent solder wave and is in the same solder reservoir 10 as the solder wave 15. The latter wave being a smooth solder.

Three lower diffusers 49 are shown in FIG. 7, positioned just below the predetermined path 16, one diffuser 49 placed on the upstream of the first solder wave 130, one between the solder waves and the third diffuser 49 positioned downstream of the second solder wave 15. A top diffuser 48 is shown above the predetermined path. In some cases more than one top diffuser 48 may be provided to ensure shield gas blankets both solder waves.

Dross formation is virtually eliminated on the solder surface in the reservoir 10 and within the enclosure 20 provided the shield gas atmosphere is maintained therein. The solder wave 15 is strikingly bright and clear due to the lack of oxygen, and it is found that this lack of oxygen reduces the number of bridges and icicles. The supplementary pressurized effect produced by the vibration of the solder wave promotes solder wetting of metallized plated holes in circuit boards and the like. This results in complete hole filling without the need of flux. In one embodiment the elements such as circuit boards and other elements are preheated in a shield gas atmosphere excluding oxygen prior to being soldered and then are permitted to cool in the shield gas atmosphere so that no liquid solder is exposed to oxygen or air. No flux is required, although the addition of substances to reduce dross or other impurities in the solder pot may be used as required. There may be certain soldering applications including difficult board designs or certain metallic surfaces where flux would enhance soldering results.

In another embodiment a retrofit enclosure is fitted to an existing wave solder apparatus. The elements to be soldered may still have to be coated with flux prior to the preheating step, but the solder is blanketed with a shield gas thus preventing the formation of dross or oxide on the solder surface.

Whereas two conveyors are illustrated in FIG. 1, a first conveyor 32 for conveying elements 18 through the solder wave 15, and a second conveyor 34 for transporting the elements 18 to the exit 30, a single conveyor may be used from entry 24 to exit 30 or more than two conveyors may be used.

Results of utilizing a vibratory wave in a shield gas atmosphere provided satisfactory soldering without fluxing. The vibratory wave appeared to assist in permitting the solder to reach all crevices and corners, and the combination of the vibratory wave in the shield gas atmosphere enhanced capillary action in the metallized plated holes in the boards so the solder rose up the component leads. The fluxless soldering in the nitrogen atmosphere appeared to have a pulsing pressure from the vibratory wave which caused a washing action to occur and aided in removing oxides from the board or elements.

Various changes may be made to the embodiments shown herein without departing from the scope of the present invention which is limited only by the following claims.

The embodiments of the present invention in which an exclusive property or privilege is claimed are defined as follows:

1. Process for wave soldering an element comprising the steps of
    preheating the element in a shield gas atmosphere substantially excluding oxygen;
    moving the element in a predetermined path;
    forming a solder wave beneath the path so that at least a portion of the element passes through the solder wave while maintaining liquid solder surfaces exposed to the shield gas;
    producing an oscillation in the solder wave during passage of the element therethrough, the frequency of oscillations being in the range of about 20 to 400 Hertz, and
    maintaining the element in the shield gas atmosphere until solder on the element has solidified.

2. The process for wave soldering an element according to claim 1 wherein the element is preheated while moving in the path prior to the solder wave.

3. The process for wave soldering an element according to claim 1 wherein the element is conveyed on a conveyor in an enclosure having the shield gas atmosphere therein.

4. The process for wave soldering an element according to claim 3 wherein the element is conveyed on a conveyor extending at an angle sloping upwards.

5. A process for wave soldering an element according to claim 3 wherein the element is conveyed on a horizontal conveyor.

6. The process for wave soldering an element according to claim 1 wherein the shield gas atmosphere is nitrogen.

7. The process for wave soldering an element according to claim 1 wherein the shield gas is supplied from at least one diffuser in the enclosure.

8. The process for wave soldering an element according to claim 7 wherein at least one first diffuser for supplying shield gas is provided on one side of the solder wave positioned below the path, at least one second diffuser for supplying shield gas is provided on the other side of the solder wave positioned below the path and at least one third diffuser for supplying shield gas is provided over the solder wave, positioned above the path, such that a shield gas blanket covers the solder wave and surrounds the element passing therethrough.

9. The process for wave soldering an element according to claim 8 wherein the shield gas blanket remains calm and non-turbulent.

10. The process for wave soldering an element according to claim 1 wherein an additive is added to the shield gas atmosphere.

11. The process for wave soldering an element according to claim 10 wherein the additive is adipic acid.

12. The process for wave soldering an element according to claim 10 wherein the additive is formic acid.

13. The process for wave soldering an element according to claim 1 wherein adipic acid in solution is applied to the element prior to heating.

14. The process for wave soldering an element according to claim 1 including the additional step of forming a second solder wave beneath the path in the shield gas atmosphere, so that at least a portion of the element passes through the second solder wave.

15. Process for wave soldering an element comprising the steps of:
   moving the element in a predetermined path through a shield gas atmosphere substantially excluding oxygen,
   forming a solder wave beneath the path so that at least a portion of the element passes through the solder wave, and
   supplying shield gas through at least one first diffuser on one side of the solder wave positioned below the path, through at least one second diffuser on the other side of the solder wave positioned below the path, and through at least one third diffuser over the solder wave positioned above the path, such that shield gas blankets the solder wave and surrounds the element passing therethrough.

16. The process for wave soldering an element according to claim 15 wherein the element is moved in a predetermined path through an enclosure surrounding the solder wave, the enclosure having a shield gas atmosphere therein.

17. An apparatus for wave soldering an element comprising,
   an enclosure for a shield gas atmosphere substantially excluding oxygen the enclosure having an entry and an exit;
   means for forming at least one solder wave in the enclosure above a solder reservoir,
   means for conveying the element in a predetermined path through the enclosure from the entry to the exit, the path ensuring at least a portion of the element passes through the solder wave from one side to the other side, and
   at least one first shield gas diffuser in the enclosure positioned on the one side of the solder wave below the predetermined path, at least one second shield gas diffuser in the enclosure positioned on the other side of the solder wave below the predetermined path, and at least one third shield gas diffuser in the enclosure positioned over the solder wave above the predetermined path, the shield gas diffusers providing a shield gas blanket within the enclosure for the solder wave and solder reservoir and the element passing through the solder wave.

18. The apparatus for wave soldering according to claim 17 wherein the diffusers are tubular in shape and extend across the solder reservoir beyond the length of the solder wave.

19. The apparatus for wave soldering according to claim 18 wherein the diffusers are made of porous metal and permit escape of shield gas around the tubular shape.

20. The apparatus for wave soldering according to claim 17 wherein two means for providing a solder wave are provided in the reservoir and wherein a further shield gas diffuser is provided in the enclosure between the solder waves, positioned beneath the predetermined path.

21. The apparatus for wave soldering according to claim 18 wherein the diffusers are formed of a sintered tube having pores in the range of about 2 to 5 microns.

22. The apparatus for wave soldering according to claim 21 wherein the inside diameter of the sintered tube is in the order of about ¼ to ⅜ of an inch.

23. The apparatus for wave soldering according to claim 17 wherein the enclosure and shield gas diffusers are provided as a retrofit package for a solder wave apparatus.

24. The apparatus for wave soldering according to claim 17 including a skirt means extending from the enclosure into the solder reservoir to prevent the escape of shield gas from the enclosure.

25. The apparatus for wave soldering according to claim 17 including curtain means at the entry and the exit to the enclosure.

26. The apparatus for wave solering according to claim 25 wherein the curtain means are gas jet curtains.

27. The apparatus for wave soldering according to claim 17 wherein the predetermined path is at an angle sloping upwards.

28. The apparatus for wave soldering according to claim 17 wherein the predetermine path is substantially horizontal.

29. An apparatus for wave soldering an element comprising:
   means for conveying the element in a predetermined path through a shield gas atmosphere substantially excluding oxygen,
   means for forming a solder wave above a solder reservoir, the predetermined path positioned so that at least a portion of the element passes through the solder wave from one side to the other side, and
   at least one first shield gas diffuser positioned on the one side of the solder wave below the predetermined path, at least one second shield gas diffuser positioned on the other side of the solder wave below the predetermined path and at least one third shield gas diffuser positioned over the solder wave above the predetermined path, the shield gas diffusers providing a shield gas blanket for the solder wave, the solder reservoir and the element passing through the solder wave.

30. The apparatus for wave soldering according to claim 29 wherein the shield gas blanket is calm and non-turbulent.

31. The apparatus for wave soldering according to claim 29 wherein the diffusers are tubular in shape and extend across the solder reservoir beyond the length of the solder wave.

32. The apparatus for wave soldering according to claim 31 wherein the diffusers are made of porous metal and permit escape of shield gas around the tubular shape.

33. The apparatus for wave soldering according to claim 31 wherein the diffusers are formed of a sintered tube having pores in the range of about 2 to 5 microns.

34. The apparatus for wave soldering according to claim 33 wherein the inside diameter of the sintered tube is in the order of about ¼ to ⅜ of an inch.

35. Process for wave soldering an element comprising the steps of:
   preheating the element in a shield gas atmosphere substantially excluding oxygen,
   moving the element in a predetermined path;
   forming at least one solder wave beneath the path so that at least a portion of the element passes through the solder wave while maintaining liquid solder surfaces exposed to the shield gas;

providing a pressurized effect on the element using a moving device within the solder wave during passage of the element therethrough, and maintaining the element in the shield gas atmosphere until solder on the element has solidified.

36. A process for wave soldering printed circuit boards comprising the steps of:

preheating the circuit boards;

moving the circuit boards in a predetermined path through a shield gas atmosphere substantially excluding oxygen forming a solder wave within the shield gas atmosphere beneath the path so that at least a portion of the circuit boards pass through the solder wave; and supplying the shield gas from at least one first gas elongated diffuser extending on one side of the solder wave positioned below the path, from at least one second gas elongated diffuser extending on the other side of the solder wave positioned below the path, and from at least one third gas elongated diffuser extending above the solder wave positioned avove the path to blanket the solder wave and the circuit boards passing therethrough.

37. An enclosure for installation over a solder reservoir having means therein for forming a solder wave, the enclosure for containing a shield gas atmosphere substantially excluding oxygen, the enclosure adapted to enclose not more than the solder reservoir and having and entry and an exit for a path of travel for circuit boards therethrough, sealing means on the enclosure to maintain the shield gas atmosphere in the enclosure, and gas distribution means for admitting shield gas into the enclosure comprising a first shield gas distributor for location in the enclosure in a position on one side of the solder wave below the path of travel, a second shield gas distributor for location in the enclosure in a position on the other side of the solder wave below the path of travel, and a third gas distributor for location in the enclosure in a position above the solder wave above the path of travel.

38. The process for wave soldering printed circuit boards comprising the steps of:

preheating the circuit boards;

moving the circuit boards in a predetermined path through an enclosure containing a shield gas atmosphere substantially excluding oxygen;

forming a solder wave above the solder reservoir within the shield gas atmosphere in the enclosure and beneath the path so that at least a portion of the circuit boards pass through the solder wave and the enclosure enclosing not more than the solder reservoir; and blanketing the solder wave and the circuit boards passing therethrough with shield gas supplied within the enclosure by a first gas distributor on one side of the solder wave positioned below the path, and by a third gas distributor above the solder wave positioned above the path.

* * * * *